(12) United States Patent
Weiss et al.

(10) Patent No.: US 7,629,202 B2
(45) Date of Patent: Dec. 8, 2009

(54) METHOD AND APPARATUS FOR ELECTROSTATIC DISCHARGE PROTECTION USING A TEMPORARY CONDUCTIVE COATING

(75) Inventors: Jonas R Weiss, Zürich (CH); Thomas E. Morf, Gross (CH); Heike E Riel, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 140 days.

(21) Appl. No.: 11/532,551

(22) Filed: Sep. 18, 2006

(65) Prior Publication Data

US 2009/0275191 A1    Nov. 5, 2009

(51) Int. Cl.
*H10L 21/44* (2006.01)
(52) U.S. Cl. ............ 438/119; 438/108; 257/E21.514
(58) Field of Classification Search ............ 438/108, 438/119, 109; 257/E21.514
See application file for complete search history.

(56) References Cited

U.S. PATENT DOCUMENTS

| | | | |
|---|---|---|---|
| 7,023,070 B2* | 4/2006 | Kato | 257/529 |
| 2005/0029642 A1* | 2/2005 | Takaya et al. | 257/678 |
| 2005/0139984 A1* | 6/2005 | Tuckerman et al. | 257/693 |
| 2005/0233569 A1* | 10/2005 | Kwon et al. | 438/613 |
| 2006/0073638 A1* | 4/2006 | Hsu | 438/110 |
| 2007/0218675 A1* | 9/2007 | Tsai | 438/613 |

* cited by examiner

*Primary Examiner*—Charles D. Garber
*Assistant Examiner*—Stanetta D Isaac
(74) *Attorney, Agent, or Firm*—Stephen C. Kaufman; Eustus D. Nelson; Daryl K. Neff

(57) ABSTRACT

A method and apparatus for providing ESD protection of an integrated circuit using a temporary conductive coating. The method deposits a temporary conductive coating upon a chip die between contacts to be protected such that a conductive path is created between contacts, provides a carrier substrate that is then bonded to the chip die and then the conductive coating is deactivated to ready the device for use. The deactivation of the conductive coating may involve physical removal of the conductive coating (or a portion thereof), oxidation of the conductive coating to form a non-conductive coating, or some other process to interrupt the conductive path between contacts. The apparatus of the invention is a chip having a temporary conductive coating deposited thereon to protect the integrated circuit from ESD events.

14 Claims, 9 Drawing Sheets

METHOD AND APPARATUS FOR ELECTROSTATIC DISCHARGE PROTECTION USING A TEMPORARY CONDUCTIVE COATING

FIELD OF THE INVENTION

The present invention relates to techniques for providing electrostatic discharge protection of integrated circuits and, more particularly, to a method and apparatus for providing electrostatic discharge protection using a temporary conductive coating.

BACKGROUND

Integrated circuits, in particular high-speed CMOS circuits, are susceptible to electrostatic discharge (ESD) damage when exposed to an ESD event. Such events occur during packaging and assembly of the integrated circuit as well as in the field during use of the circuitry. Currently a special protection circuit such as diodes and/or transistors are placed at the circuit peripheral nodes (e.g., leads or pads) to clamp the high voltage of an ESD event to a level that will not damage the circuitry within the integrated circuit. As circuit speed increases, device feature size is reduced. However, this is not true for the ESD protection circuits, which cannot be scaled to a smaller size if the same level of ESD protection must be maintained. Furthermore, as feature size decreases and circuit speed increases, parasitic capacitance of these ESD protection circuits becomes detrimental to circuit performance.

Additionally, as integrated circuit size has reduced, the packaging has also been reduced in size. The use of Controlled Collapsed Chip Connections (C4), also known as flip chip technology, has found widespread use to provide improved electrical interconnect performance for small integrated circuit packages. Where the pitch of connections has been reduced to 50 micrometers, C4NP (C4 New Process) can be used to provide connectivity. With such a small pitch, there is no room on an integrated circuit to include ESD protection devices having a level of ESD protection commensurate with the protection level provided to the larger devices of the past.

Therefore, there is a need in the art for an ESD protection technique that does not rely on active devices to protect the integrated circuit from ESD events during packaging and assembly.

SUMMARY

The present invention generally relates to a method and apparatus for ESD protection of an integrated circuit and other sensitive electronic devices using a temporary conductive coating. The method deposits a temporary conductive coating upon a chip die between contacts to be protected such that a conductive path is created between contacts, and provides a carrier substrate that is then bonded to the chip die. Then, the conductive coating is deactivated to ready the device for use. The deactivation of the conductive coating may involve removal of the conductive path, transformation of the conductive coating to form a non-conductive coating (e.g. by oxidation), or some other process to interrupt the conductive path between contacts. The apparatus of the invention is a chip die having a temporarily conductive coating deposited thereon to protect the chip die from ESD events.

BRIEF DESCRIPTION OF THE DRAWINGS

The above and other items, features and advantages of the present invention will be better understood by reading the following description of the present invention in conjunction with the accompanying drawings, wherein.

DETAILED DESCRIPTION

The present invention provides the use of a temporary conductive coating to protect an integrated circuit from an ESD event during at least a portion of integrated circuit manufacturing. Specifically, a conductive coating is applied across the input and output contacts of a chip die. This conductive coating ensures that there will not be a voltage potential established between contacts as a result of an ESD event. Once assembled, the conductive coating is deactivated by either converting the conductive coating to a non-conductive coating or physically removing the conductive coating that is located between the contacts of the integrated circuit.

Figure 1:
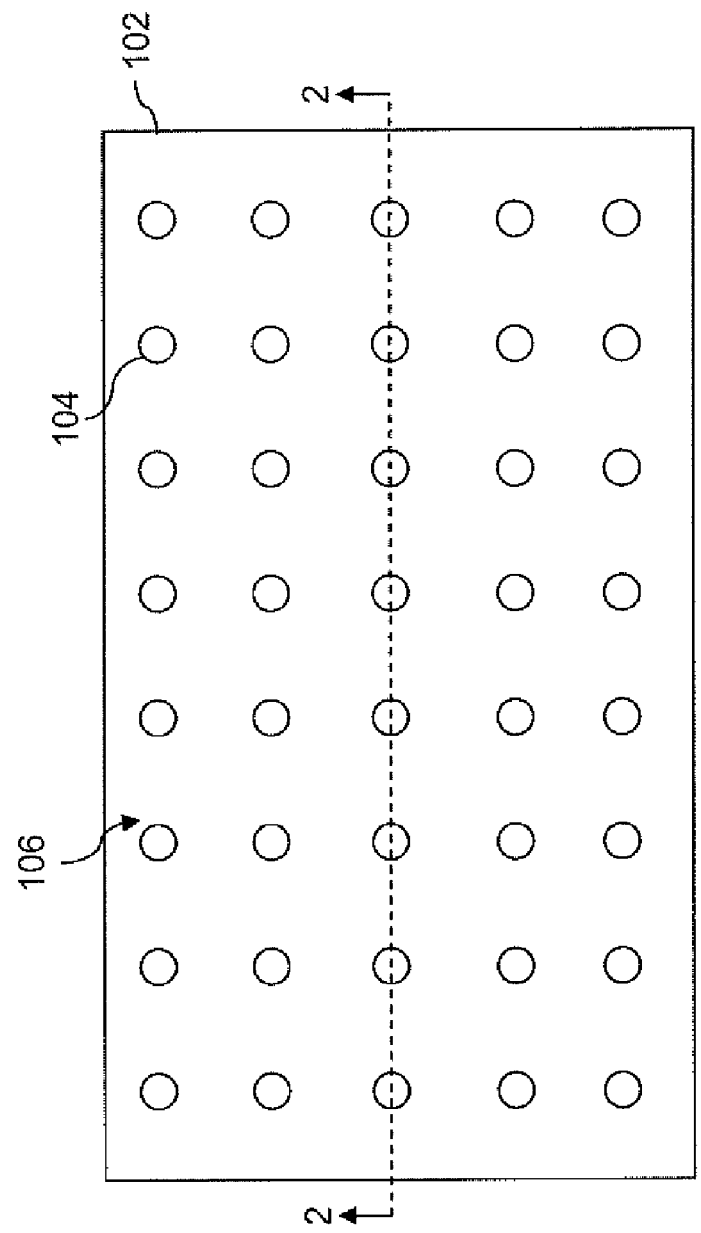
FIG. 1 depicts a top plan view of a portion of an integrated circuit (chip die) having an array of ball-type conductive contacts.

FIG. 1 depicts a top (plan) view of a chip die 102 that houses the integrated circuitry and a plurality of ball-type conductive contacts 104 that form input/output pads for the circuitry. The conductive contacts 104 are commonly known as solder bumps. These solder bumps 104 are typically arranged in an array 106 having columns and rows. However, those skilled in the art, will understand that the present invention may be applied to any arrangement of any type of contacts used in integrated circuit technology.

Figure 2:
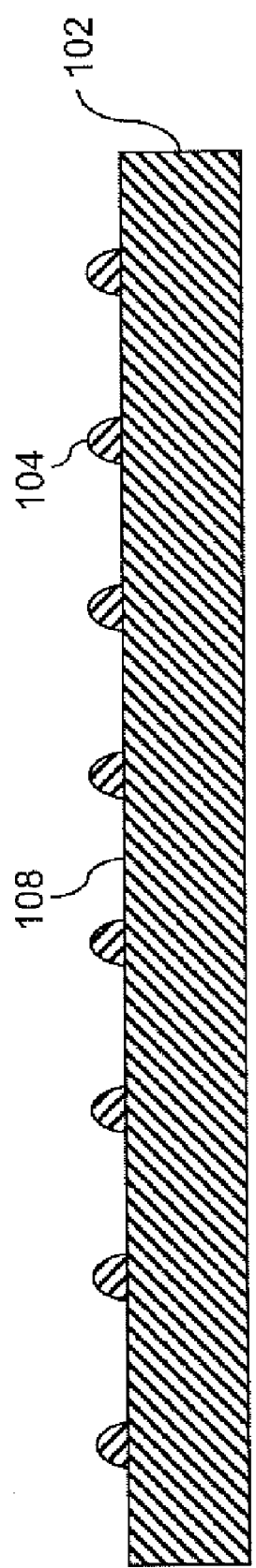
FIG. 2 depicts a cross sectional view along line 2-2 of the integrated circuit of FIG. 1.
Figure 3:
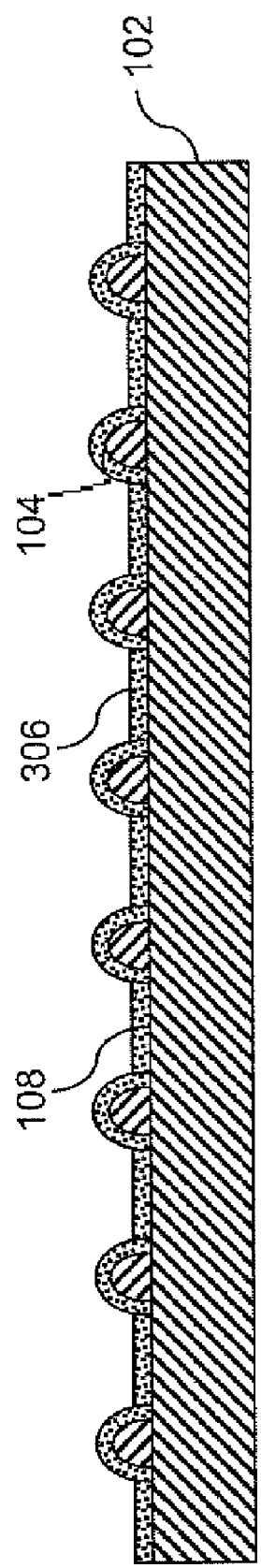
FIG. 3 depicts the cross sectional view of the integrated circuit of FIG. 2 including a uniform conductive coating.

FIG. 2 depicts a cross sectional view of the chip die 102 along lines (2-2) of FIG. 1. The solder bumps 104 protrude from the chip surface 108. The solder bumps 104 may be fabricated of a conductive material, a metal or metal-alloy such as gold, gold-tin, aluminum, indium, lead, lead-tin, indium-tin, titanium-nitride, silver, copper, antimony, titanium, vanadium, chromium, nickel, tungsten, platinum, palladium and others. FIG. 3 depicts the chip die 102 having a conductive coating 306 applied to the surface 108 of the chip die 102 such that the conductive coating 306 interconnects the contacts 104 on the surface 108 that are to be protected. Such a high conductivity interconnection (path) by the conductive coating 306 ensures that the voltage at all of the contacts 104 is equal. As such, a voltage difference can not be generated between contacts upon the occurrence of an ESD event that may harm the circuitry within the chip die 102. Once coated, the chip is not susceptible to ESD event damage. The conductive coating 306 may comprise a metal, metal-alloy, conductive organic substance, conductive oxides, nitrides and the like. In one embodiment, the conductive coating 306 is an alloy of gold and tin having 70% of gold and 30% of tin. The conductive coating 306 is typically deposited using at least one of chemical vapor deposition, physical vapor deposition, electroless deposition, electrochemical deposition, sputtering, spin coating, spraying, immersion coating and the like.

Figure 4:
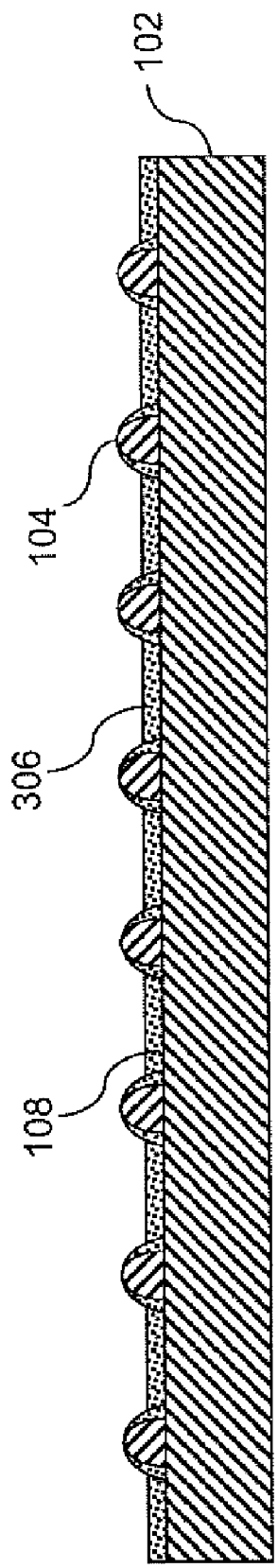
FIG. 4 depicts the integrated circuit of FIG. 3 with the coating optionally removed at the contact locations.

FIG. 4 depicts an optional process step wherein the chip die 102 of FIG. 3 has the conductive coating 306 removed at the tops of each of the contacts 104. This removal process exposes the solder bumps 104 to facilitate bonding the chip die to a carrier substrate. The removal of the material of the coating 306 may be provided by polishing, etching, ion sputtering or other processes known in the semiconductor industry for removal of conductive materials.

Figure 5:
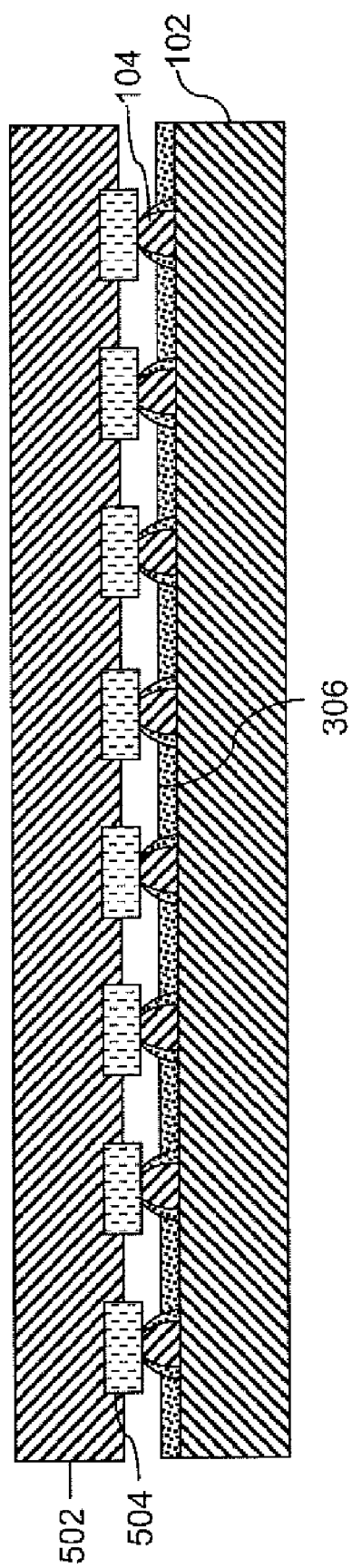
FIG. 5 depicts the provision of a carrier substrate being positioned atop the integrated circuit of FIG. 4.
Figure 6:
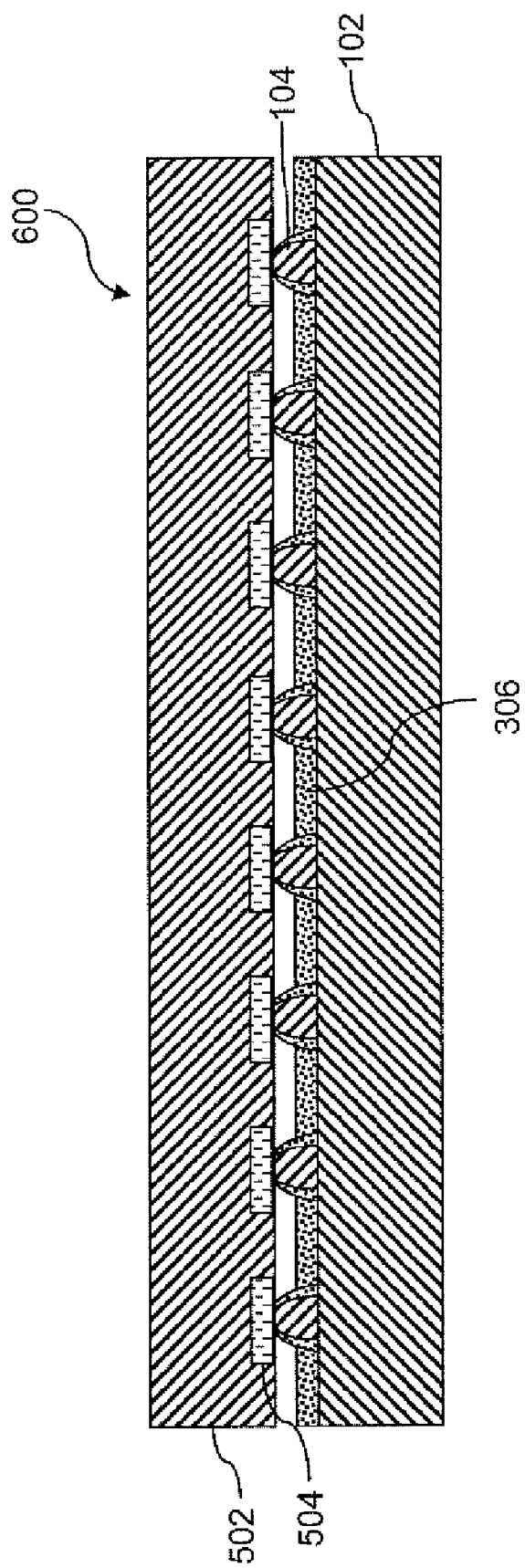
FIG. 6 depicts the assembly of a carrier substrate and the integrated circuit of FIG. 4 bonded to one another.

FIG. 5 depicts a carrier substrate 502 with carrier substrate conductive contacts 504 positioned proximate to the contacts 104 of the chip die 102. The conductive contacts 504 of the carrier substrate 502 are coated, e.g., with an alloy of 20% gold and 80% tin. FIG. 6 depicts the conductive contacts 504 of the carrier substrate 502 being bonded to the contacts 104 of the chip die 102. This bonding is performed by a well-known process, e.g., heating the carrier substrate 502 and chip die 102 to a temperature where the solder bumps 104 melt and bond to the contacts 504 of the substrate carrier 502. When heated the alloy of the carrier substrate contact blends with the alloy of the solder bump 104 and/or the conductive coating 306 to form a blend of approximately 50% gold and 50% tin. This 50/50 mixture has a melting point of approximately 418 degrees Centigrade, while the melting temperature of the conductive coating, assuming a 60/40% gold-tin alloy, is approximately 380 degrees Centigrade. Other bonding techniques, e.g., non-melting techniques, may also be used to attach the chip die 102 to the carrier substrate 502. After bonding, the ESD protection is intact; therefore, the carrier substrate 502 may be handled without fear of damage from an ESD event.

Figure 7:
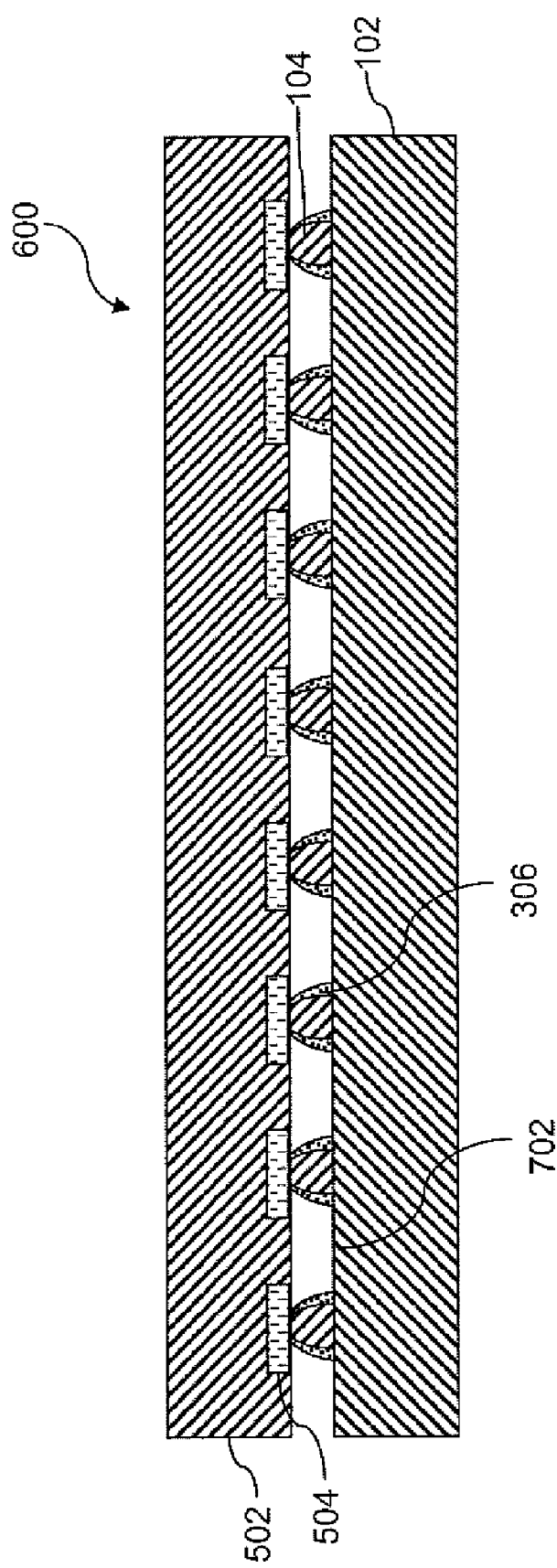
FIG. 7 depicts the assembly of FIG. 6, where the conductive coating between the conductive contacts has been removed.

FIG. 7 depicts the assembly 600 of FIG. 6 having the conductive coating 306 deactivated between the contacts 104 of the chip die 102. The deactivation process removes the conductivity of the path between the contacts 104 to be protected. The conductive coating 306 may be deactivated by physically removing the conductor between the contacts 104 or by deactivating the conductivity of the conductive coating by converting the conductor into an insulator, such as, e.g., an oxide. In one embodiment, the coating 306 is removed by heating the assembly 600 to a temperature that melts the coating 306, but below the melting point of the solder bumps 104. When heated, the coating 306 breaks up and forms little balls/islands of metal that do not form a conductive path between the balls, i.e., upon heating, the conductive film no longer forms a conductive path between the contacts 104 of the chip die 102. This behavior may be enhanced by depositing a suitable layer (e.g., Teflon) underneath the conductive coating 306 to form a bi-layer structure. As such, the conductive layer, though not removed, is rearranged to interrupt the conductive path between the contacts.

Figure 8:
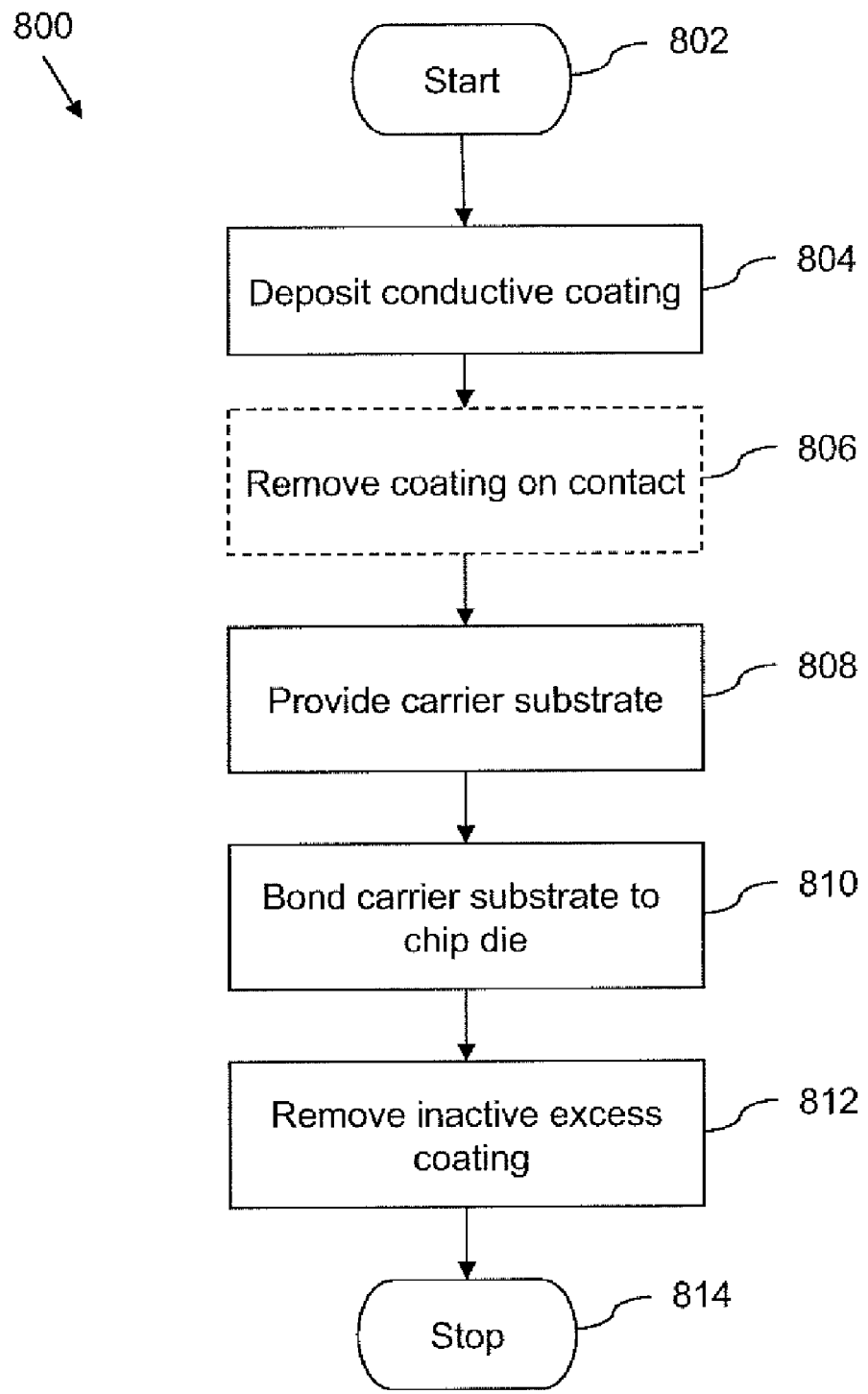
FIG. 8 depicts a flow diagram of a process for utilizing the present invention.

FIG. 8 depicts a flow diagram of one embodiment of the present invention as a method 800 of protecting an integrated circuit during ESD events that may occur during assembly and packaging. The method 800 summarizes the process previously described with reference to FIGS. 1 through 7. The method 800 begins with having a chip die provided at step 802. In one embodiment of the invention, this step is performed during chip manufacturing usually after on-wafer testing is complete. At step 804, a conductive coating is deposited upon the chip die using a deposition technique that will maintain the temperature of the chip die below a temperature that would harm the solder bumps or the circuitry within the integrated circuit. If the coating is sputtered onto the chip die, the coating is applied at approximately room temperature.

At optional step 806 (shown in phantom), the method 800 removes the coating at the contacts such that the contacts are exposed.

At step 808, a carrier substrate is provided having contacts that align with the solder bumps of the chip. At step 810, the carrier substrate is bonded to the chip die by raising the temperature of the assembly to a temperature that allows the solder bumps to melt and bond to the conductive contacts of the substrate carrier. At step 812, the excess of conductive coating is deactivated either by removal of the conductive path or by conversion to an insulator. At step 814, the method 800 ends.

Figure 9:
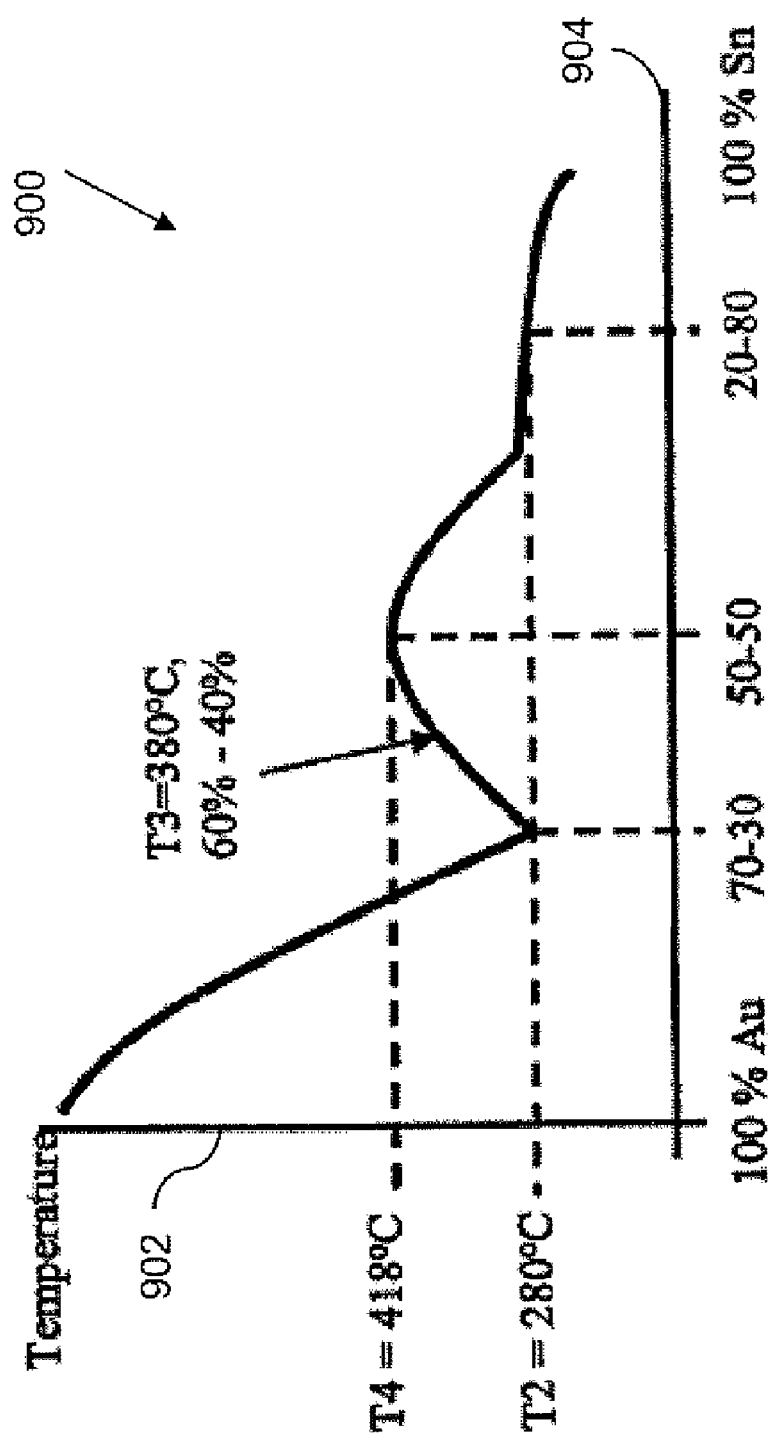
FIG. 9 depicts a phase diagram of a gold-tin alloy used for providing a conductive coating in accordance with one embodiment of the present invention.

FIG. 9 depicts the phase diagram 900 for an exemplary material that may be used as a conductive coating in the present invention. The graph 900 depicts the phase diagram of a gold-tin alloy, including specific eutectic temperatures (melting points) of various mixtures of gold and tin. The graph 900 comprises a first axis 902 representing temperature and a second axis 904 representing the percentage of gold and tin within the alloy. With this graph, solder bump and conductive coating compositions may be selected that allow, bonding of the chip die to a carrier substrate without harming the coating and removal of the coating without harming the die-substrate bonds. As such, a conductive coating is applied to the chip at a first temperature T1, while the bonding of the carrier substrate to the chip is performed at a second temperature indicated as T2 on the graph 900. The deposition temperature T1 is below temperature T2. The conductive coating is then removed using a temperature T3 that facilitates removal by melting of the conductive material between the contacts. For the example shown, the mixture of 70% gold and 30% tin for the solder bumps and a carrier substrate coating of 20% gold and 80% tin will melt and mix at 280 degrees Centigrade. The mixture results in the bonds having about 50% gold and 50% tin. The 50/50 bond melting temperature is now 418 degrees Centigrade. The conductive coating (e.g., 60/40% gold/tin) has a melting temperature of 380 degrees Centigrade, well below that of the bond between the solder bump and the carrier substrate, and therefore the conductive path can be safely removed at temperature T3=380 degrees Centigrade.

In other embodiments of the invention the coating may be of various materials and/or material combinations that have a conductive state and a non-conductive (insulating) state or may be transformed from a conductive to an insulating state. In one alternative embodiment, the conductive coating may be a bi-layer structure having a first layer deposited on the chip die comprising a first conductive material or material composition and a second layer deposited atop of the first layer comprising a second material. The second layer need not be conductive. The second layer can be removed after assembly by, e.g. heating the assembly to a temperature that removes the material by melting or vaporization. The first conductive material can be converted by transformation to a nonconductive material through heating or exposure to other chemicals. In one example, the conductor may be transformed to an insulator by oxidation. For example, if the first conductive material is aluminum, the aluminum can be oxidized to form aluminum oxide, thus, transforming the conductor to an insulating material. Oxygen can be provided from gaseous or liquid phase processing chemicals. Other materials would be, e.g., calcium, lithium, magnesium and alloys such as MgAg and the like. To block exposure to oxygen while in the conductive state, a capping layer of, for example, gold, can be used as the second layer of a bi-layer structure. The gold layer can be melted when the underlying layer is to be exposed to oxygen and converted to a non-conductive state.

In a further embodiment, the conductive coating may be a bi-layer structure having a first layer deposited on the chip die comprising a first material or material composition such as an oxide. A second layer deposited on the top of the first layer is conductive and provides the required conductivity to act as an ESD protection coating. During or after the assembly of the chip die and carrier substrate, the bi-layer is heated to a temperature where the oxygen of the first layer is partly or completely transferred into the second layer destroying its conductivity. Therefore, the first layer acts as an oxygen reservoir (source with respect to the second layer) but remains non-conductive after the process. This process may be enhanced by certain conditions, e.g., oxygen plasma, ozone treatment, oxygen-rich environment during annealing. One exemplary material for the first layer is vanadium-oxide, e.g., $V_2O_5$, which will provide oxygen to the second layer and remain a non-conductive oxide, e.g., $V_2O_3$ or $VO_2$. Another possibility would be that the materials of each layer of the bi-layer structure mix to create a non-conductive layer.

In a further embodiment, a conductive organic material may be used as the conductive layer, and the conductive nature of the material may be converted to a nonconductive material. Organic materials can be applied to the chip using spin-coating, roll-to-roll processes, printing, inkjet printing, and the like. The conductivity of organic materials can be removed by exposing the layer to an ozone atmosphere or oxygen plasma. Elevated temperatures may be used to enhance the conductivity removal process. Alternatively, the material may be physically removed from between the contacts using solvents. Examples for the organic materials are Poly(3,4-ethylenedioxythiophene) poly(styrenesulfonate) (PEDOT) and Polyaniline (PAni).

While the foregoing is directed to embodiments of the present invention, other and further embodiments of the invention may be devised without departing from the basic scope thereof, and the scope thereof is determined by the claims that follow.

We claim:

1. A method of protecting an integrated circuit of a chip die from an electrostatic discharge event comprising:
   a) coating contacts of a chip die containing the integrated circuit with a conductive material where contacts to be protected are conductively interconnected by a conductive path and
   removing a portion of the conductive material proximate each contact
   b) after step (a) bonding the contacts of the chip die to a carrier substrate; and
   c) after step (b) deactivating the conductive path between the contacts.

2. A method of protecting an integrated circuit of a chip die from an electrostatic discharge event comprising:
   a) coating contacts of a chip die containing the integrated circuit with a conductive material where contacts to be protected are conductively interconnected by a conductive path;
   b) after step (a) bonding the contacts of the chip die to a carrier substrate; and
   c) after step (b), deactivating the conductive path between the contacts, wherein the deactivating step comprises removal of at least a portion of the conductive material by a removal process including raising a temperature of the conductive coating above a eutectic temperature of the conductive material.

3. The method of claim 1, wherein the deactivating step comprises processing at least a portion of the conductive material to interrupt the conductive path between contacts.

4. The method of claim 3, wherein the conductive material is exposed to at least one of oxidizing or nitridizing agents.

5. A method of protecting an integrated circuit of a chip die from an electrostatic discharge event comprising:
   a) coating contacts of a chip die containing the integrated circuit with a conductive material where contacts to be protected are conductively interconnected by a conductive path;
   b) after step (a), bonding the contacts of the chip die to a carrier substrate; and
   c) after step (b), deactivating the conductive path between the contacts by a process including rearranging at least a portion of the conductive material to interrupt the conductive path between contacts.

6. The method of claim 1, wherein step (b) further comprises raising the temperature of the contacts above a eutectic temperature of a material comprising the contact.

7. The method of claim 1, wherein the conductive material comprises at least one of gold, tin, aluminum, gold-tin, indium, lead, lead-tin, silver, copper, antimony, titanium, titanium-nitride, vanadium, chromium, nickel, tungsten, platinum, palladium and indium-tin.

8. The method of claim 1, wherein the conductive material comprises a gold-tin alloy having a eutectic temperature higher than the eutectic temperature of a material comprising a bond between the carrier substrate and the chip.

9. The method of claim 1, wherein the conductive material comprises a bi-layer of two materials.

10. The method of claim 9, wherein the two materials include a first material being a conductive material that is capable of changing into an insulator upon exposure to a particular atmosphere and a second material which forms a capping layer to protect the first material from the atmosphere.

11. The method of claim 10, wherein step (c) comprises, removal of the capping layer to expose the first material to the particular atmosphere.

12. The method of claim 9, wherein the two materials include a first material being an oxygen source that releases oxygen upon heating and a second material which is capable of changing to an insulator when exposed to oxygen.

13. The method of claim 12, wherein step (c) comprises, heating the first material to expose the second material to oxygen.

14. The method of claim 1, wherein the conductive material is an organic material.

* * * * *